(12) United States Patent
Chow et al.

(10) Patent No.: US 8,196,106 B2
(45) Date of Patent: Jun. 5, 2012

(54) AUTONOMIC VERIFICATION OF HDL MODELS USING REAL-TIME STATISTICAL ANALYSIS AND LAYERED FEEDBACK STAGES

(75) Inventors: Mike Chow, Wappingers Falls, NY (US); Rebecca Marie Gott, Poughkeepsie, NY (US); Christopher Dao-Ling Lei, Poughkeepsie, NY (US); Naseer Shamsul Siddique, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 1104 days.

(21) Appl. No.: 12/057,742

(22) Filed: Mar. 28, 2008

(65) Prior Publication Data
US 2009/0249123 A1 Oct. 1, 2009

(51) Int. Cl.
*G06F 9/44* (2006.01)
*G06F 11/00* (2006.01)
*G06F 17/50* (2006.01)

(52) U.S. Cl. ......... 717/124; 717/126; 717/127; 714/25; 714/720; 714/738; 714/742; 716/51; 716/106; 716/136

(58) Field of Classification Search ............... None
See application file for complete search history.

(56) References Cited

U.S. PATENT DOCUMENTS

| | | | |
|---|---|---|---|
| 5,673,387 A | 9/1997 | Chen et al. | |
| 5,694,540 A | 12/1997 | Humelsine et al. | |
| 5,754,760 A * | 5/1998 | Warfield | 714/38.1 |
| 6,415,396 B1 * | 7/2002 | Singh et al. | 714/38.13 |
| 6,708,324 B1 | 3/2004 | Solloway et al. | |
| 6,941,546 B2 * | 9/2005 | Apuzzo et al. | 717/135 |
| 6,986,125 B2 * | 1/2006 | Apuzzo et al. | 717/124 |
| 6,993,470 B2 * | 1/2006 | Baumgartner et al. | 703/17 |
| 7,197,427 B2 * | 3/2007 | Noonan et al. | 702/179 |
| 7,577,875 B2 * | 8/2009 | Nelson et al. | 714/38.14 |
| 7,840,844 B2 * | 11/2010 | Garland et al. | 714/33 |
| 7,844,350 B2 * | 11/2010 | Puri et al. | 700/30 |
| 2002/0066077 A1 * | 5/2002 | Leung | 717/126 |
| 2003/0037314 A1 * | 2/2003 | Apuzzo et al. | 717/125 |
| 2004/0148590 A1 * | 7/2004 | Lapitski et al. | 717/124 |
| 2005/0246207 A1 * | 11/2005 | Noonan et al. | 705/4 |
| 2007/0022407 A1 * | 1/2007 | Givoni et al. | 717/124 |
| 2007/0220338 A1 * | 9/2007 | Birmiwal et al. | 714/33 |
| 2007/0240116 A1 * | 10/2007 | Bangel et al. | 717/124 |

OTHER PUBLICATIONS n. Gnanasekaran et al. "Automated Regression Testing Framework", White Paper, pp. 2-19.*

* cited by examiner

*Primary Examiner* — Isaac Tecklu
(74) *Attorney, Agent, or Firm* — John E. Campbell; Daniel E. McConnell

(57) ABSTRACT

Real-time statistical analysis is used to perform autonomic self-healing within the context of a 3-tier regression system for analysis of a computer system design component. Throughout the system, there are mechanisms for implementing self-healing if breakage is detected. The regression layer with the highest throughput is maintained in a much cleaner state than otherwise, thereby creating a more efficient environment for identifying and removing defects in the design.

20 Claims, 4 Drawing Sheets

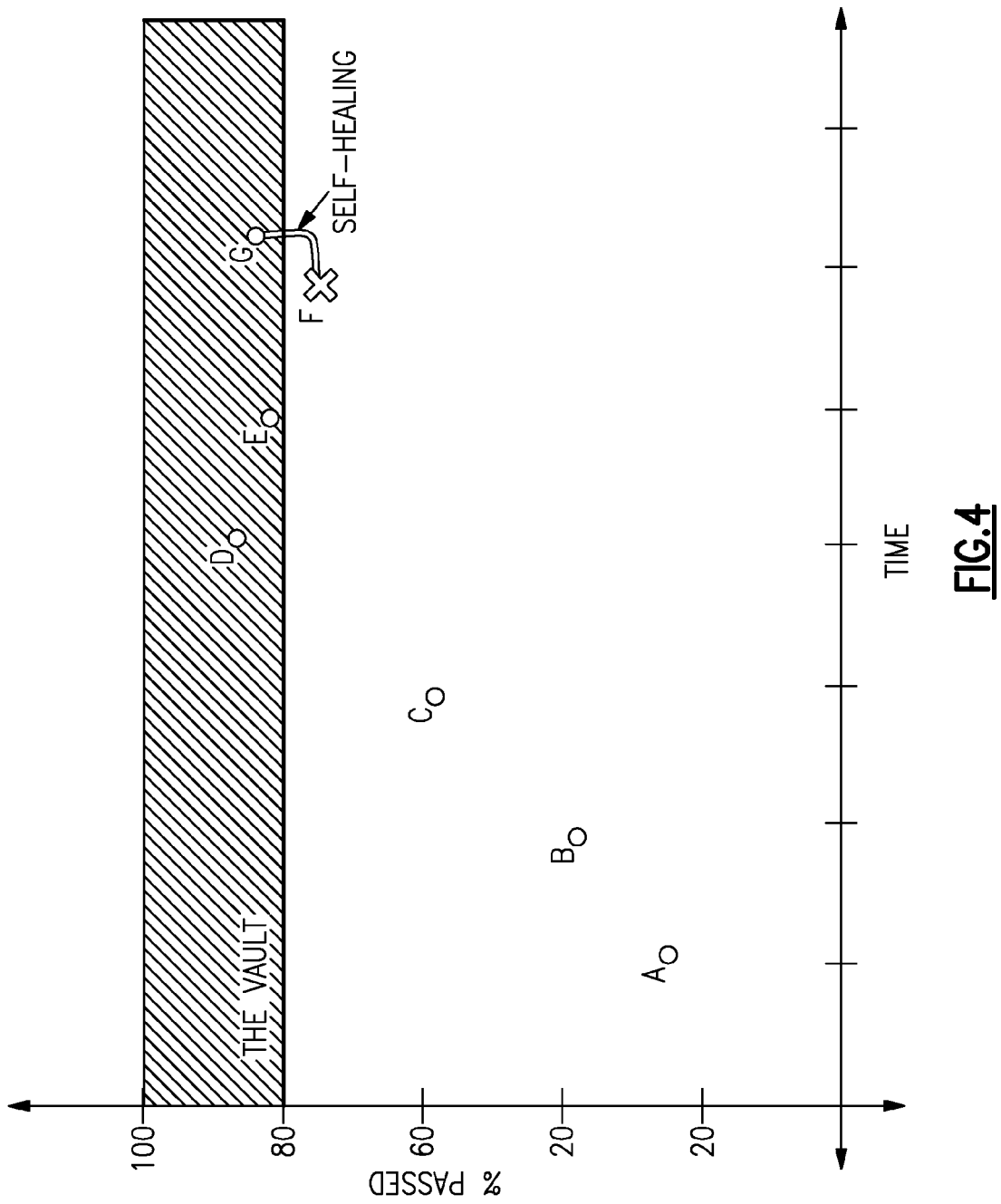

AUTONOMIC VERIFICATION OF HDL MODELS USING REAL-TIME STATISTICAL ANALYSIS AND LAYERED FEEDBACK STAGES

FIELD AND BACKGROUND OF INVENTION

This invention relates to systems, computer-implemented methods, and computer program products for verification of Hardware Descriptor Language (HDL) hardware models.

Before this invention, it was a common challenge in the field of hardware verification to efficiently detect and react to the negative effects of a constantly evolving simulation code and logic design base. The existing methodology involves human monitoring of regression buckets for failing test runs; however, the sheer volume of data makes it very difficult to analyze every testcase in the context of past behavior. As a result, there is often a lag between when a testcase starts failing and when it is identified as having incurred breakage, and by that time it is much more difficult to isolate the root cause because more hardware and code changes have been promoted. Moreover, once the problem has been identified, a manual process of backing out the offending code and/or logic is both time-consuming and error-prone. Automating both of these processes allows the verification engineer to focus on the primary goal of identifying hardware bugs and also promotes an efficient environment in which to do so.

SUMMARY OF THE INVENTION

The shortcomings of the prior art are overcome and additional advantages are provided through the provision of a system that uses real-time statistical analysis to perform autonomic self-healing within the context of a 3-tier regression system. Because each layer has higher bandwidth than the layers before it, the effects are amplified as breakage propagates to later stages. As a result, the goal at each layer is to protect the lower layers from experiencing breakage. Throughout the system, there are mechanisms for implementing self-healing without human intervention if breakage is detected. By using this invention in a regression system, the regression layer with the highest throughput is maintained in a much cleaner state than otherwise, thereby creating a more efficient environment for identifying and removing defects in the hardware design.

System and computer program products corresponding to the above-summarized methods are also described and claimed herein. Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF DRAWINGS

Some of the purposes of the invention having been stated, others will appear as the description proceeds, when taken in connection with the accompanying drawings, in which:

FIG. 4 illustrates in graphical form the behavior of a "vault" characteristic of the Regression Health Monitor.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
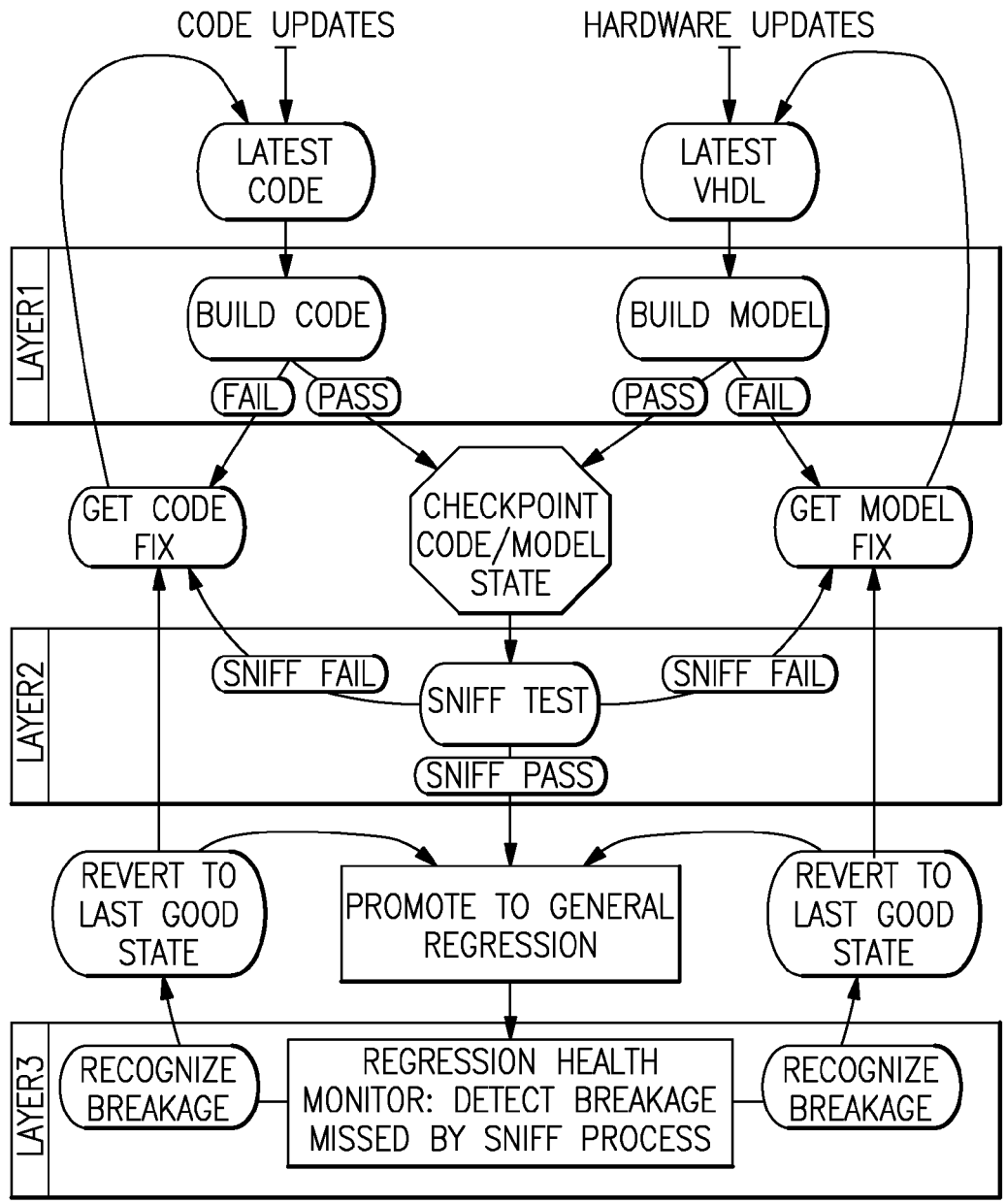
FIG. 1 is a block diagram illustrating a complete flow of a three tier regression system, highlighting each regression layer and depicting the logical progression between layers.

Turning now to the drawings in greater detail, it will be seen that in FIG. 1 there are three layers in the regression system of the present invention. Updates to simulation code (indicated at 11) or to the HDL design (indicated at 12) must progress to Layer 3 in order to be considered part of general regression.

As changes are committed to the simulation code base and to the HDL design and introduced to Layer 1, routine checks are performed to ensure that the resulting code and model can compile without error. If this step is successful, the code and logic are checkpointed for possible restart in a future self-healing action as described hereinafter. If the latest code or model fails during compilation in this layer, then notification is sent of the broken state. At this point, human intervention is required to commit a fix for the broken code or hardware design. When the fix is committed, Layer 1 tests are re-performed.

Once committed changes pass Layer 1, Layer 2 performs a Sniff Test, which is a brief set of simulations culled from the set of known passing testcases. This performs coarse detection of breakage. If the changes succeed during sniff tests, then they are promoted to Layer 3. If the sniff tests fail, then just as when Layer 1 fails, notification is sent of the breakage and must await a fix. This repair action requires human intervention.

Fine detection of breakage occurs at Layer 3, which is the primary regression vehicle with massive throughput. A Regression Health Monitor sits at this layer to document the evolving pass rate of all running testcases and to detect breakage and self-heal as needed.

Figure 2:
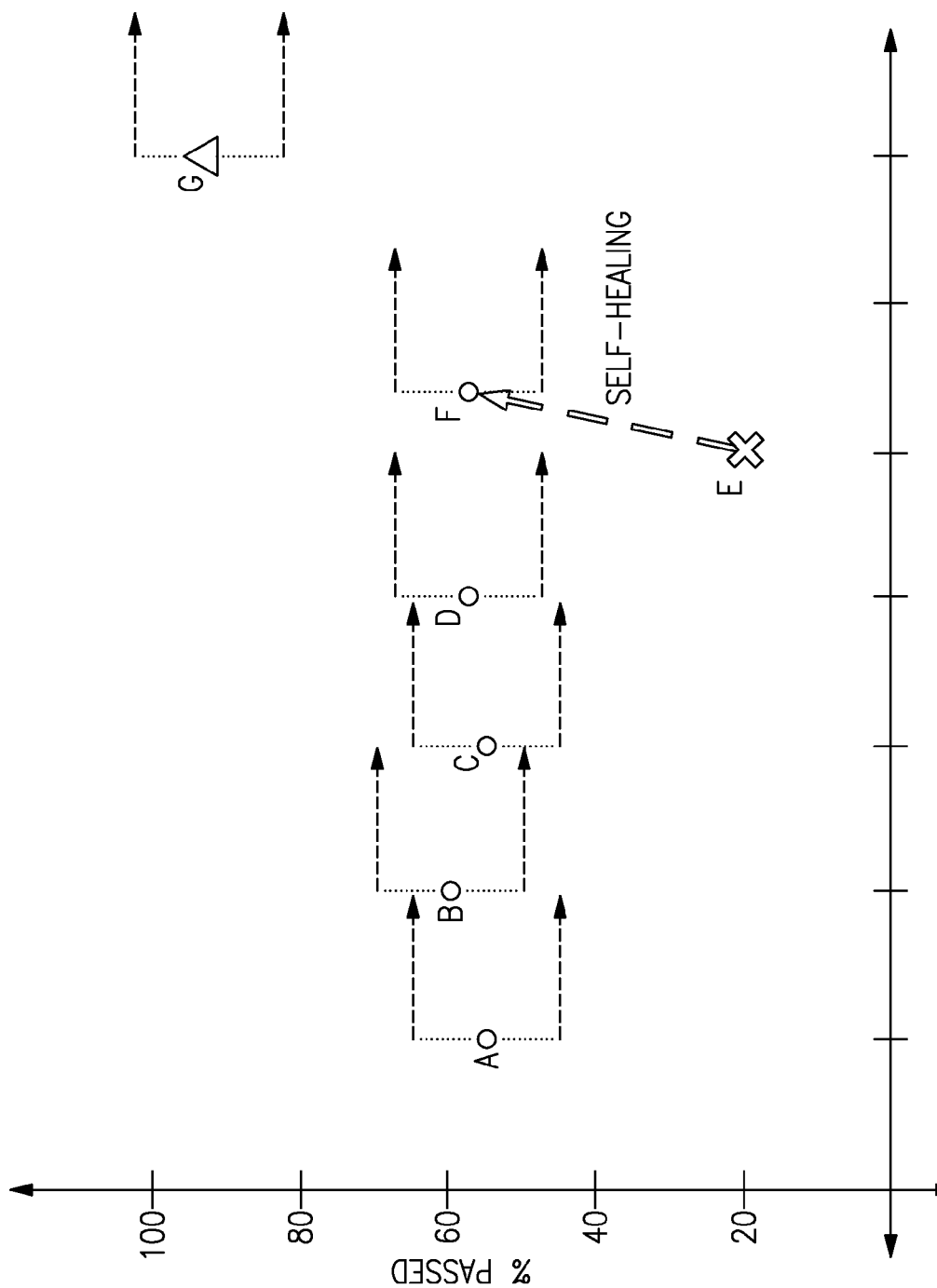
FIG. 2 illustrates in graphical form the normal expected behavior, as well as the behavioral response to statistical aberrations detected by a Regression Health Monitor, the third layer within the regression system described hereinafter.
Figure 3:
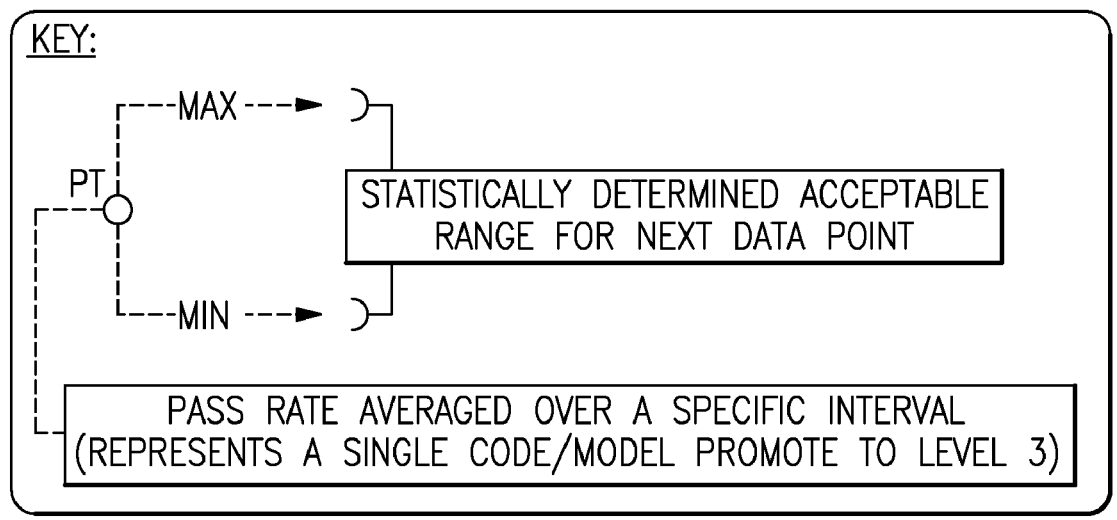
FIG. 3 is an expanded view of a portion of the graphical representation in FIG. 2, illustrating in greater detail bracketing of data points by statistical analysis.

The Regression Health Monitor employed in Layer 3 is illustrated in more detail in FIGS. 2 and 3. Each data point correlates to a pass rate averaged on a particular testcase since the previous change to the regression code or design. This invention assumes that over time, the pass rate for a testcase will steadily increase as bugs are found and cleaned in a design. For each data point (pass rate), the next data point is expected to occur within a statistically determined range unless major fixes or breakage are introduced. This window of tolerated pass rate is indicated in the diagram with a dotted line originating at each point and denoting an upper and lower limit. This is clarified by the greater detail shown in FIG. 3. The role of the Regression Health Monitor is to respond appropriately to behavior that occurs outside these expected windows.

As illustrated in FIG. 2, Points A, B, C, an D are all examples of "normal" behavior because they depict a range of fluctuation in the pass rate deemed acceptable according to the previous data point. For example, B falls within the window that A predicted for it. Similarly for C and B, and D and C.

Point E illustrates one example of a negative aberration detected by the regression system. It highlights the autonomic self-healing and notification to the user. This self-healing uses the checkpointing that takes place between Layer 1 and Layer 2 to return to the last known good state, denoted by Point F. Note that there is no window of expected behavior associated with Point E because the system is reverting back to a known state.

Point G illustrates an example of a positive aberration detected by the regression system. It highlights the action taken by the system to provide notification of the significant improvement in the testcase pass rate, and an increase in the expected pass rate for the next data point. In this way, the adaptive regression system will continuously improve critical testcase regression stability by increasing the tolerated fail threshold over the course of the project. With each successive increase in the threshold, a higher pass rate becomes the new standard.

FIG. 4 illustrates a subset of the Regression Health Monitor called the "vault", a form of retained storage. When a testcase pass rate reaches a certain user-specified threshold (e.g. 95%), that testcase is considered to be in the vault, which results in a notification to the user and tagging of the testcase as being retained. In the figure, Point D exemplifies a testcase that just entered the vault. If the pass rate of a vault testcase ever subsequently drops below the threshold, as shown at Point F, this will cause an instant notification of breakage and possible self-healing through reversion to the last good code and hardware checkpoint. This self-healing is demonstrated in the transition from Point F to Point G. The vault mechanism is particularly useful in managing the case where a hardware or code update fixes one testcase but breaks another. The incremental goal through development is to update the code and hardware such that increasing numbers of testcases can enter the vault, each without causing previous vault testcases from dropping out. The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

In the drawings and specifications there has been set forth a preferred embodiment of the invention and, although specific terms are used, the description thus given uses terminology in a generic and descriptive sense only and not for purposes of limitation.

What is claimed is:

1. A method which verifies a computer system design component using a computer system having a processor comprising:
    performing by a processor tiered regression analysis of a computer system design component using a plurality of test cases submitted to and processed by the processor;
    performing a second tier analysis of the testcase which passes first tier analysis while retaining the state of the design component which passed the first tier analysis as a checkpoint;
    performing a third tier analysis of the testcase which passes the second tier analysis while monitoring a comparison of the pass rate to a statistically determined acceptable range of pass rates;
    retaining in defined storage a design component for which the testcase pass rate is above a predetermined threshold; and
    reverting to the retained checkpoint design component state in the event that the testcase pass rate falls below the predetermined threshold.

2. A method according to claim 1 wherein the computer system design component is a Hardware Descriptor Language hardware model.

3. A method according to claim 1 wherein the computer system design component is simulation code.

4. A method according to claim 1 further comprising determining whether the testcase fails at the first tier analysis and, in response to a determination of a failure, reporting a need to modify the design component.

5. A method according to claim 1 further comprising determining whether the testcase fails at the second tier analysis and, in response to a determination of failure, reporting a need to modify the design component.

6. A method according to claim 1 further comprising determining whether the testcase fails at the third tier analysis and, in response to a determination of failure, performing the step of reverting to a retained checkpoint design component state.

7. A method according to claim 1 further comprising determining whether the testcase fails at the first tier analysis and, in response to a determination of a failure, reporting a need to modify the design component and determining whether the testcase fails at the second tier analysis and, in response to a determination of failure, reporting a need to modify the design component.

8. An apparatus which verifies a computer system design component comprising:
    a computer system having a processor; and
    program code stored accessibly to said computer system and effective when executing on said computer system processor to perform tiered regression analysis of a computer system design component, said program code directing said computer system to:
    perform by a processor tiered regression analysis of a computer system design component using a plurality of testcases submitted to and processed by the processor;
    perform a second tier analysis of the testcase which passes first tier analysis while retaining the state of the design component which passed the first tier analysis as a checkpoint;
    perform a third tier analysis of the testcase which passes the second tier analysis while monitoring a comparison of the pass rate to a statistically determined acceptable range of pass rates;

retain in defined storage a design component for which the testcase pass rate is above a predetermined threshold; and revert to the retained checkpoint design component state in the event that the testcase pass rate falls below the predetermined threshold.

9. An apparatus according to claim 8 wherein the computer system design component is a Hardware Descriptor Language hardware model.

10. An apparatus according to claim 8 wherein the computer system design component is simulation code.

11. An apparatus according to claim 8 wherein said program code directs said computer system to determine whether the testcase fails at the first tier analysis and, in response to a determination of a failure, reports a need to modify the design component.

12. An apparatus according to claim 8 wherein said program code directs said computer system to determine whether the testcase fails at the second tier analysis and, in response to a determination of failure, reports a need to modify the design component.

13. An apparatus according to claim 8 wherein said program code directs said computer system to determine whether the testcase fails at the third tier analysis and, in response to a determination of failure, perform a reversion to a retained checkpoint design component state.

14. An apparatus according to claim 8 wherein said program code directs said computer system to determine whether the testcase fails at the first tier analysis and, in response to a determination of a failure, reports a need to modify the design component and further wherein said program code directs said computer system to determine whether the testcase fails at the second tier analysis and, in response to a determination of failure, reports a need to modify the design component.

15. An apparatus which verifies a computer system design component comprising:

a non-transitory program storage device readable by a computer system which has a processor: and a program of instructions tangibly embodied on said program storage device and executable by a computer system processor to perform tiered regression analysis of a computer system design component, said program instructions directing said computer system to:

perform tiered regression analysis of a computer system design component using a plurality of test cases submitted to and processed by a processor;

perform a second tier analysis of the testcase which passes first tier analysis while retaining the state of the design component which passed the first tier analysis as a checkpoint;

perform a third tier analysis of the testcase which passes the second tier analysis while monitoring a comparison of the pass rate to a statistically determined acceptable range of pass rates;

retain in defined storage a design component for which the testcase pass rate is above a predetermined threshold; and revert to the retained checkpoint design component state in the event that the testcase pass rate falls below the predetermined threshold.

16. An apparatus according to claim 15 wherein the computer system design component is a Hardware Descriptor Language hardware model.

17. An apparatus according to claim 15 wherein the computer system design component is simulation code.

18. An apparatus according to claim 15 wherein said program instructions direct said computer system to determine whether the testcase fails at the first tier analysis and, in response to a determination of a failure, reports a need to modify the design component.

19. An apparatus according to claim 15 wherein said program instructions direct said computer system to determine whether the testcase fails at the second tier analysis and, in response to a determination of failure, reports a need to modify the design component.

20. An apparatus according to claim 15 wherein said program instructions direct said computer system to determine whether the testcase fails at the third tier analysis and, in response to a determination of failure, perform a reversion to a retained checkpoint design component state.

* * * * *